United States Patent [19]

Steiner

[11] Patent Number: 5,282,318
[45] Date of Patent: Feb. 1, 1994

[54] POSITION SENSOR

[76] Inventor: Carl Steiner, Dr. Hans-Frisch-Str. 9, D-8580 Bayreuth, Fed. Rep. of Germany

[21] Appl. No.: 910,349

[22] PCT Filed: Jan. 16, 1991

[86] PCT No.: PCT/DE91/00040
§ 371 Date: Jul. 20, 1992
§ 102(e) Date: Jul. 20, 1992

[87] PCT Pub. No.: WO91/10879
PCT Pub. Date: Jul. 25, 1991

[30] Foreign Application Priority Data

Jan. 18, 1990 [DE] Fed. Rep. of Germany ....... 9000619

[51] Int. Cl.$^5$ .................. G01C 21/08; G01C 17/30
[52] U.S. Cl. ..................... 33/355 R; 33/346; 33/361; 33/363 R
[58] Field of Search ............ 33/355 R, 344, 346, 33/354, 356, 357, 361, 363 R, 364

[56] References Cited

U.S. PATENT DOCUMENTS 4,546,550 10/1985 Marchent et al. ............ 33/356

FOREIGN PATENT DOCUMENTS

| 02544613 | 1/1988 | European Pat. Off. ............ 33/361 |
| 1773303 | 10/1971 | Fed. Rep. of Germany . |
| 2929504 | 1/1980 | Fed. Rep. of Germany . |
| 3012241 | 10/1981 | Fed. Rep. of Germany . |
| 3224633 | 1/1983 | Fed. Rep. of Germany . |
| 2186694 | 8/1987 | United Kingdom . |

Primary Examiner—William A. Cuchlinski, Jr.
Assistant Examiner—C. W. Fulton
Attorney, Agent, or Firm—Jordan and Hamburg

[57] ABSTRACT

A position sensor has a ring of a material of high permeability that is floated on a liquid within a hermetically sealed toroid, so as to hold the ring in a horizontal position. Exciting coils are distributed uniformly about the ring to enclose the cross section thereof, and receiving coils are distributed uniformly about the circumference of the ring.

18 Claims, 2 Drawing Sheets

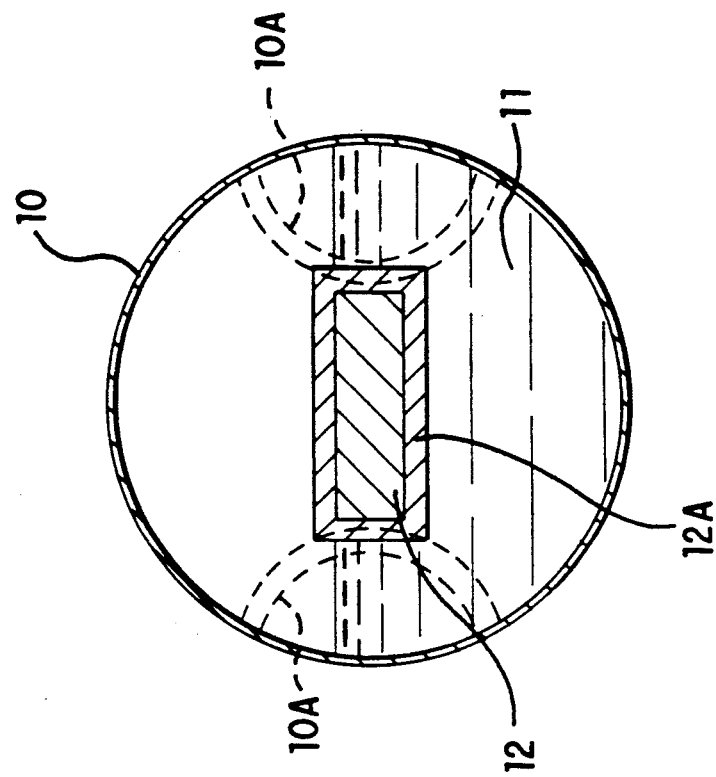
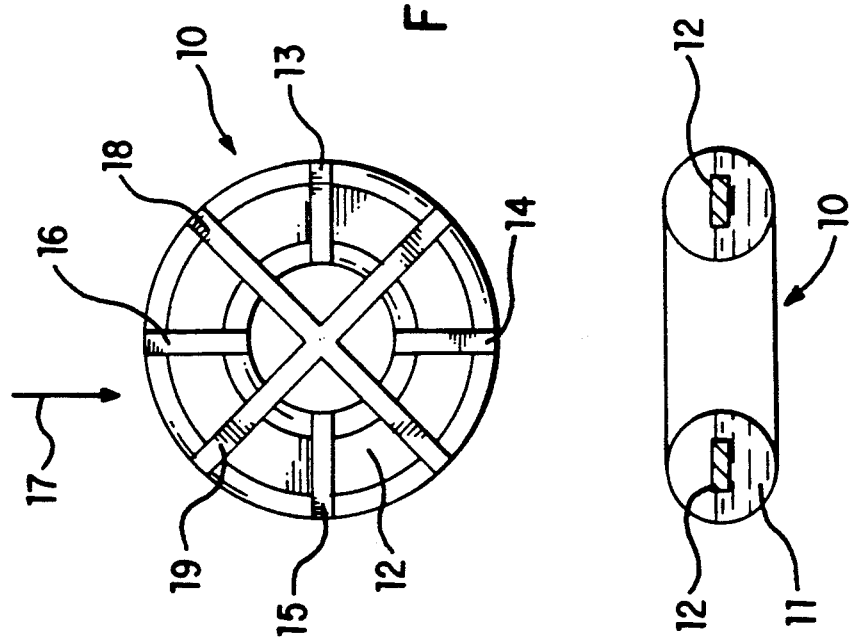

POSITION SENSOR

BACKGROUND OF THE INVENTION

A position sensor is disclosed in German Auslegeschrift 1,773,303. In this known apparatus, a core is surrounded by an exciting coil, which is coiled uniformly about the core and which is energized by a periodic voltage or a periodic current, so that the core is driven far enough into the saturation range. Four receiving coils are disposed over the circumference, offset in each case by 90°, the diametrically opposed receiving coils being connected back-to-back. By forming the difference between the voltages induced in the pairs of receiving coils, the transformed voltage basically is cancelled in these coils. However, an external magnetic field, particularly the horizontal component of the earth's magnetic field, brings about a shift in the operating point on the characteristic magnetization curve, which results in a phase shift that causes a non-cancelling voltage portion. This consists essentially of harmonics of an even order of the exciting frequency, the amplitudes of which are proportional to the external magnetic field. In the evaluating circuit, which is connected with the receiving coil, the second harmonic advisably is evaluated in order to generate a signal which corresponds to the direction of the external magnetic field. As a result of the inhomogeneities and asymmetries in the core and in the coils, this apparatus is not suitable for more accurate measurements. Moreover, it has a plurality of components and is therefore quite expensive. Even in the case of a variation with an annular magnetic core floating in a hermetically sealed toroid, said toroid is supported on a quite expensive suspension device.

French publication 2,601,185 discloses a magnetic core for a compass, in which the receiver coils embrace the annular magnetic core diametrically and do not embrace the cross section of the annular magnetic core, as they do in the aforementioned German Auslegeschrift 1,773,303.

German Offenlegungsschrift 3,012,241 discloses a further apparatus for measuring a magnetic field. For this apparatus, a liquid-supported float is used, which can be pivoted on a bearing shaft lying in a horizontal plane. The bearing shaft rests in an orbiting guiding groove, so that the float can also carry out a rotational movement. A rigid assignment of the float to a particular orientation of the housing is thus not assured.

SUMMARY OF THE INVENTION

It is an object of the invention to provide an apparatus of the initially mentioned type, which relatively inexpensively provides a measurement of high reliability and accuracy. Briefly stated, in accordance with the invention, a position sensor is provided in which a ring of a material of high permeability is floated on a liquid within a toroid, so as to hold the ring in a horizontal position. Exciting coils are distributed uniformly about the ring to enclose the cross section thereof, and receiving coils are distributed uniformly about the circumference of the ring.

The invention is described in the following disclosure with examples and reference to the Figures. In the drawings:

FIG. 1 is a plan view of the apparatus for measuring the magnetic field,

FIG. 2 is a cross section through the apparatus of FIG. 1,

FIG. 2A is a cross sectional view, on a larger scale than FIG. 2, of an alternate embodiment in which the annular element 12 of FIG. 2 is surrounded by a sheath.

DETAILED DISCLOSURE OF THE INVENTION

Figure 3:
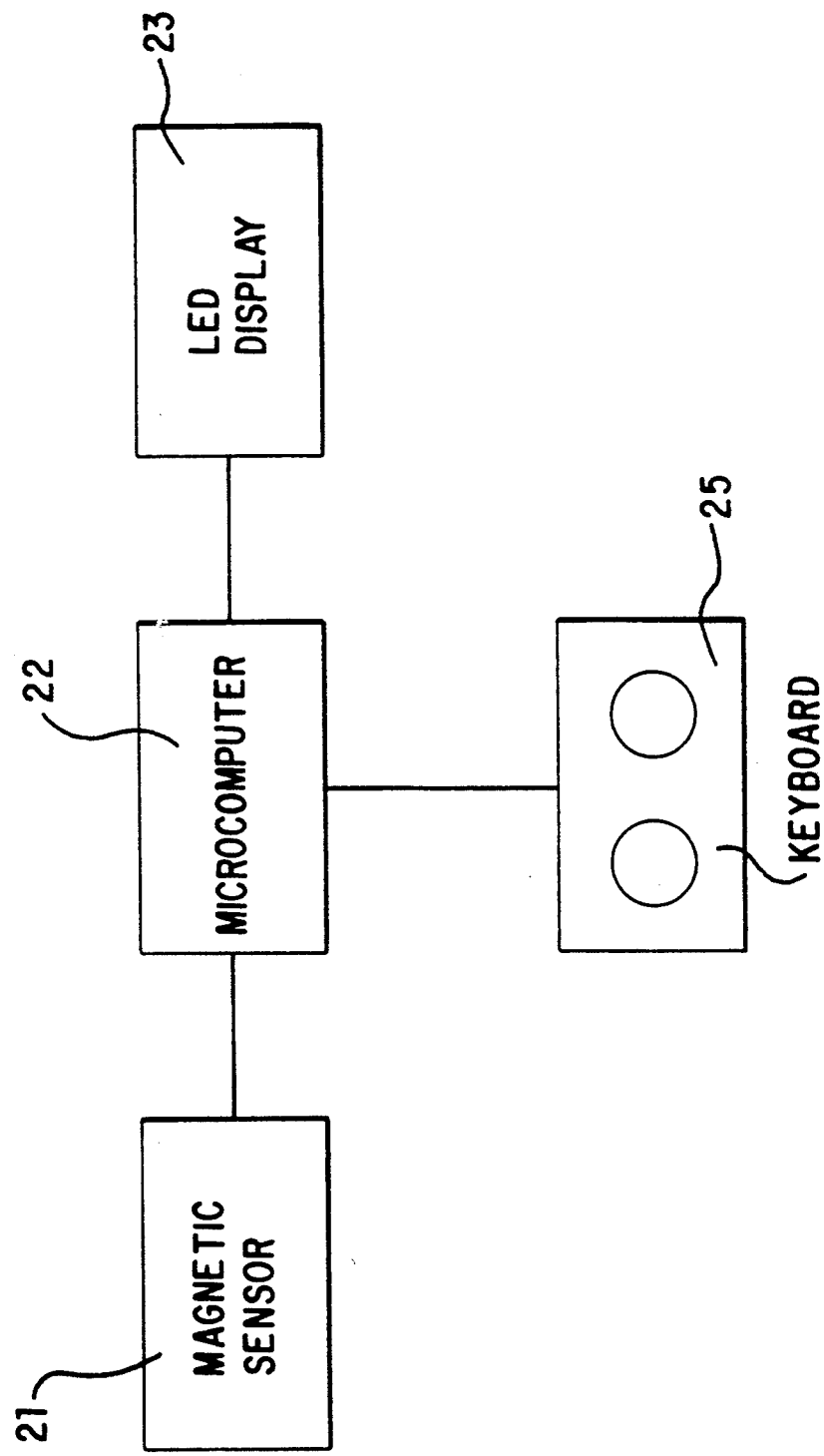
FIG. 3 is a diagrammatic representation of the linkage of the individual parts of the apparatus to one another.

The toroid 10, is externally hermetically sealed towards the outside and shown in plan view in FIG. 1, and is disposed in binoculars (not shown), so that its principal plane is approximately horizontal. The interior of the toroid is partially filled with a rather low viscosity liquid 11, preferably corresponding to half the volume of the toroid. The low viscosity of the liquid ensures a high reaction speed and a low tendency to form bubbles. An annular element 12 of a highly permeable material, which may also be surrounded by a plastic sheath 12a as shown in FIG. 2A floats on the liquid. Since the toroid is kept in an essentially horizontal plane and the surface of the liquid 11 automatically aligns itself horizontally, a horizontal position of the annular element 12 is ensured. This is a prerequisite for actually measuring the horizontal component of the earth's magnetic field. Exciting coils 13, 14, 15 and 16 surround the cross section of the toroid 10. They are mutually offset from one another by 90°, distributed uniformly over the circumference of the toroid 10 and connected electrically one after the other in such a manner, that they generate within the annular element 12 a magnetic field of uniform direction that is closed on itself (for example, in the clockwise direction). Superimposed on the magnetic field generated in this manner, is the external magnetic field, the earth's magnetic field, for example, in the direction of the arrow 17, with the result that the excited magnetic field and the earth's magnetic field interact subtractively in the left part of the toroid 10, that is, the cross section embraced by the exciting coil 15, and additively in the right part, that is, in the cross section embraced by the exciting coil 13. This results in correspondingly transformed voltages and currents in the receiving coils 18 and 19, which embrace the toroid 10 diametrically.

The exciting coils 13 to 16 are excited sufficiently to saturate the core. By forming the difference between the voltages of the receiving coils 18, 19, the induced voltage is basically cancelled. However, the external magnetic field, in this case the earth's magnetic field in the direction of the arrow 17, brings about a shift in the operating point on the characteristic magnetizing curve. This, in turn, results in a phase shift, from which an uncompensated voltage portion arises essentially with harmonics of even order of the natural frequency. The amplitudes of the uncompensated voltage portion are proportional to the external magnetic field, that is, to the earth's magnetic field.

The second harmonic is preferably used for evaluation in order to generate a signal corresponding to the direction of the external magnetic field.

For the number of four exciting coils 13 to 16 and two receiving coils 18 and 19 shown in the Figures, the mutual offset angle in each case is 90°. The coils 13-16 of the one type are offset with respect to the coils 18,19 of the other type by 45°.

If the number of coils is different, the angles, of course, also are different.

If necessary, the annular element 12 of highly permeable material is surrounded with a plastic sheath, in order to ensure that the annular element 12 will float and also will slide better on the inner walls of the toroid 10.

If the annular element 12 is twisted in the clockwise or counterclockwise direction, inhomogeneities can lead to a distortion of the measurement results. For this reason, the annular element 12, if necessary, is secured against twisting. This is accomplished by a guiding groove in the sheathing of the annular element 12 and a corresponding projecting 10a part in the toroid 10 or vice versa.

The measurement data is supplied to an evaluating device. This may be a microprocessor, which permits a plurality of measurements to be carried out in rapid temporal sequence with the binoculars either in the same or in different target directions. In the case of position measurements from a swaying object, such as a land, air or sea vehicle (for example, at sea), an average value—with higher accuracy, of course—can be formed and stored from the plurality of the individual measurements with the help of a microprocessor.

The stored individual values or averaged measurement values can be called in at the appropriate time from where they are stored in the memory and shown on a display. There is therefore no need for troublesome handwritten notes during the position measurements under possibly unfavorable wind and weather conditions.

The whole of the electronics can be accommodated on a relatively small board, which is disposed above the usual binoculars construction.

Conventional directional binoculars require appreciable decay times before a measurement can be carried out. These times are shortened very appreciably with the apparatus described above.

For fixing the position, the binoculars are provided with a known reticle.

Declination errors are compensated for in the software by appropriate programming by putting in a correction value, which corresponds to the position on earth and can be taken from the relevant charts.

A key is depressed in order to set the declination. For a 10° east declination, the direction end turns to the right when the key is depressed, until the display reads 10. For a declination of 20° west it turns to the left when the key is depressed, until the display shows 340° (360°-20°). The key is subsequently released again. The declination value is stored at a special location in the memory and can be displayed, as such, on request.

To compensate for inclination errors, differently balanced fluid capsules were used in the past. For the user, this means that a different fluid capsule is required if the binoculars are to be used in a different zone of the earth. This exchange can normally be carried out only by the manufacturer. Inclination errors do not occur in the electronic system described above.

The directional binoculars are operated with conventional, commercial batteries. So as not to drain the energy source unnecessarily, the instrument automatically turns itself off after a specified time of non-use.

Any defects in the system or insufficiently charged batteries can be indicated during the switching-on phase.

The measured or stored and re-called values are shown, on demand, by an LED display 23 (FIG. 3) and mirrored into the beam path of the binoculars. Optionally, the LED can also be installed directly in the beam path of the binoculars. The luminosity can be controlled as a function of the brightness of the surroundings, that is, as a function of the light shining in through the lens, in order to avoid undesirable blinding effects at night or at dusk.

In FIG. 3, the functional linking of the individual parts of the apparatus is shown diagrammatically. The measured values are passed from the magnetic field sensor 21 to a microcomputer 22 and processed and, if necessary corrected (compensation for declination and inclination errors, etc.). The uncorrected or corrected values, as well as any specified values in the computer program can be displayed on the aforementioned LED display 23. This display is mirrored into the beam path of the binoculars, unless the LED display 23 is disposed directly in the beam path of the binoculars. The desired functions of the microcomputer are controlled from a keyboard 25.

I claim:

1. An apparatus for determining a position on earth by measuring the earth's magnetic field, comprising a magnetic field probe with an annular element of a material of high permeability, the annular element being disposed to float in a hermetically sealed toroid, exciting coils being distributed uniformly about the circumference of the toroid and embracing the cross section of the toroid and being offset from one another by a first angle, receiving coils distributed uniformly about the circumference of the toroid and offset from another by a second angle, the receiving coils diametrally embracing the toroid, said toroid being partially filled with a liquid, said annular element being secured against twisting.

2. The apparatus of claim 1 wherein the toroid has a circular cross section.

3. The apparatus of claim 1 wherein the liquid in the toroid is a liquid of low viscosity.

4. The apparatus of claim 1 wherein the annular element of high permeability is surrounded by a plastic sheath.

5. The apparatus of claim 4 wherein the plastic sheath is provided with a guiding groove to secure the annular element against twisting.

6. The apparatus of claim 1 wherein the receiving coils are connected to a measuring and evaluating circuit.

7. The apparatus of claim 6 wherein the evaluating circuit is connected to a memory circuit for the measured data.

8. The apparatus of claim 7 wherein the evaluating circuit is provided with an addition to compensate for declination and inclination errors.

9. The apparatus of claim 1 wherein the evaluating circuit is provided with an addition to form the average value for a plurality of measured values obtained in a short temporal sequence.

10. An apparatus for sensing the earth's magnetic field, comprising a hermetically sealed toroid, a liquid partially filling said toroid, an annular member of a material of high permeability in said toroid and floating on said liquid, whereby said toroid may be held with said annular member extending in a horizontal plane; a plurality of exciting coils uniformly distributed about the circumference of said toroid with first angular displacements therebetween, each of said exciting coils being linked with said toroid to surround a separate cross section of said annular member, a plurality of receiving coils uniformly distributed about the circumference of said toroid with second angular displacements therebetween, said receiving coils diametrally surrounding said toroid, and means for producing an output signal responsive to the difference between voltages induced in said receiving coils by said exciting coils.

11. The apparatus of claim 10 further comprising indicating means connected to receive said output signal.

12. The apparatus of claim 10 wherein said first and second angular displacements are different from one another.

13. The apparatus of claim 10 having four exciting coils and two receiving coils, whereby said first angular displacement is 90° and said second angular displacement is 180°, said exciting coils being angularly displaced from said receiving coils by 45°.

14. The apparatus of claim 10 wherein said exciting coils are energized sufficiently to magnetically saturate said annular member.

15. The apparatus of claim 10 wherein said toroid is half full of said liquid.

16. The apparatus of claim 10 wherein said means for producing said output signal comprises an evaluating circuit for evaluating voltages induced in said receiving coils.

17. The apparatus of claim 16 wherein said evaluating circuit comprises means for evaluating the second harmonic of the voltages induced in said receiving coils.

18. The apparatus of claim 10 further comprising a plastic sheath on said annular member.

* * * * *